US011431279B2

(12) United States Patent
Peterson et al.

(10) Patent No.: US 11,431,279 B2
(45) Date of Patent: Aug. 30, 2022

(54) SOLAR ROOF TILE WITH A UNIFORM APPEARANCE

(71) Applicant: Tesla, Inc., Austin, TX (US)

(72) Inventors: Carl Peterson, Los Gatos, CA (US); John Liu, Fremont, CA (US); Milan Padilla, Mountain View, CA (US)

(73) Assignee: Tesla, Inc., Austin, TX (US)

( * ) Notice: Subject to any disclaimer, the term of this patent is extended or adjusted under 35 U.S.C. 154(b) by 0 days.

(21) Appl. No.: 16/025,834

(22) Filed: Jul. 2, 2018

(65) Prior Publication Data

US 2020/0007074 A1    Jan. 2, 2020

(51) Int. Cl.
*H02S 40/36* (2014.01)
*H02S 20/25* (2014.01)
*H01L 31/048* (2014.01)

(52) U.S. Cl.
CPC .......... *H02S 20/25* (2014.12); *H01L 31/0488* (2013.01); *H02S 40/36* (2014.12); *H01L 31/0481* (2013.01)

(58) Field of Classification Search
CPC ....................... H02S 40/36; H02S 20/25; H01L 31/042–048; H01L 31/0488; H01L 31/0481
See application file for complete search history.

(56) References Cited

U.S. PATENT DOCUMENTS

| | | |
|---|---|---|
| 3,076,861 A | 2/1963 | Samulon |
| 3,369,939 A | 2/1968 | Myer |
| 3,461,602 A | 8/1969 | Heinz |
| 4,239,810 A | 12/1980 | Alameddine |
| 4,724,011 A | 2/1988 | Turner |
| 5,118,540 A | 6/1992 | Hutchison |
| 5,149,351 A * | 9/1992 | Yaba .......................... B60J 7/04 257/E27.125 |
| 5,338,369 A | 8/1994 | Rawlings |

(Continued)

FOREIGN PATENT DOCUMENTS

| | | |
|---|---|---|
| CN | 102544380 | 8/2015 |
| CN | 103426957 | 3/2016 |

(Continued)

OTHER PUBLICATIONS

Advisory Action received for U.S. Appl. No. 15/719,244, dated Aug. 12, 2020, 6 pages.

(Continued)

*Primary Examiner* — Uyen M Tran
(74) *Attorney, Agent, or Firm* — Dentons US LLP

(57) ABSTRACT

One embodiment can provide a photovoltaic roof tile. The photovoltaic roof tile can include a transparent front cover, a back cover, a plurality of photovoltaic structures positioned between the front cover and the back cover, and a front-cover-colorant layer positioned on an interior surface of the transparent front cover that faces a top surface of the photovoltaic structures. A color of the front-cover-colorant layer can substantially match a color of the top surface of the photovoltaic structures, and the front-cover-colorant layer can be configured to cover regions of the interior surface that are not directly above the top surface of the photovoltaic structures, thereby enabling a substantially uniform appearance of the photovoltaic roof tile.

12 Claims, 15 Drawing Sheets

(56) References Cited

U.S. PATENT DOCUMENTS

| | | | |
|---|---|---|---|
| 5,427,961 A | 6/1995 | Takenouchi | |
| 5,590,495 A | 1/1997 | Bressler et al. | |
| 5,667,596 A | 9/1997 | Tsuzuki | |
| 5,942,048 A | 8/1999 | Fujisaki | |
| 6,133,522 A | 10/2000 | Kataoka | |
| 6,307,144 B1 | 10/2001 | Mimura et al. | |
| 6,311,436 B1 | 11/2001 | Mimura | |
| 6,365,824 B1 | 4/2002 | Nakazima | |
| 6,472,594 B1 | 10/2002 | Ichinose | |
| 6,515,216 B2 | 2/2003 | Zenko et al. | |
| 6,586,271 B2 | 7/2003 | Hanoka | |
| 6,620,645 B2 | 9/2003 | Chandra et al. | |
| 6,960,716 B2 | 11/2005 | Matsumi | |
| 7,259,321 B2 | 8/2007 | Oswald | |
| 7,276,724 B2 | 10/2007 | Sheats | |
| 7,506,477 B2 | 3/2009 | Flaherty | |
| 7,534,956 B2 | 5/2009 | Kataoka | |
| 7,772,484 B2 | 8/2010 | Li | |
| 7,833,808 B2 | 11/2010 | Xu | |
| 7,851,700 B2 | 12/2010 | Luch | |
| 7,858,874 B2 | 12/2010 | Ruskin | |
| 7,902,451 B2 | 3/2011 | Shimizu | |
| 7,964,440 B2 | 6/2011 | Salleo | |
| 8,205,400 B2 | 6/2012 | Allen | |
| 8,206,664 B2 | 6/2012 | Lin | |
| 8,276,329 B2 | 10/2012 | Lenox | |
| 8,471,141 B2 | 6/2013 | Stancel | |
| 8,664,030 B2 | 3/2014 | Luch | |
| 8,674,377 B2 | 3/2014 | Farquhar | |
| 8,701,360 B2 | 4/2014 | Ressler | |
| 8,713,861 B2 | 5/2014 | Desloover | |
| 8,822,810 B2 | 9/2014 | Luch | |
| 9,038,330 B2 | 5/2015 | Bellavia | |
| 9,150,966 B2 | 10/2015 | Xu | |
| 9,206,520 B2 | 12/2015 | Barr | |
| 9,343,592 B2 | 5/2016 | Hunt | |
| 9,362,527 B2 | 6/2016 | Takemura | |
| 9,412,884 B2 | 8/2016 | Heng | |
| 9,525,092 B2 | 12/2016 | Mayer | |
| 9,825,582 B2 | 11/2017 | Fernandes | |
| 9,882,077 B2 | 1/2018 | Morad et al. | |
| 9,899,554 B2 | 2/2018 | Yang | |
| 9,966,487 B2 | 5/2018 | Magnusdottir | |
| 10,056,522 B2 | 8/2018 | Gonzalez | |
| 10,145,116 B2 | 12/2018 | Holt et al. | |
| 2001/0054435 A1 | 12/2001 | Nagao | |
| 2002/0015782 A1 | 2/2002 | Abys | |
| 2002/0185171 A1 | 12/2002 | Huang et al. | |
| 2003/0180983 A1 | 9/2003 | Oswald | |
| 2004/0261840 A1 | 12/2004 | Schmit | |
| 2005/0039788 A1 | 2/2005 | Blieske | |
| 2005/0268963 A1 | 12/2005 | Jordan | |
| 2006/0048798 A1 | 3/2006 | McCoy | |
| 2006/0086620 A1 | 4/2006 | Chase | |
| 2006/0204730 A1 | 9/2006 | Nakamura | |
| 2008/0135085 A1 | 6/2008 | Corrales | |
| 2008/0178932 A1* | 7/2008 | Den Boer | H01L 31/022466 |
| | | | 136/256 |
| 2009/0101192 A1 | 4/2009 | Kothari | |
| 2009/0120497 A1 | 5/2009 | Schetty | |
| 2009/0133738 A1 | 5/2009 | Shiao et al. | |
| 2009/0133739 A1 | 5/2009 | Shiao | |
| 2009/0133740 A1 | 5/2009 | Shiao | |
| 2009/0233083 A1 | 9/2009 | Inoue | |
| 2009/0242021 A1 | 10/2009 | Petkie | |
| 2009/0255568 A1 | 10/2009 | Morgan | |
| 2009/0287446 A1 | 11/2009 | Wang | |
| 2009/0308435 A1 | 12/2009 | Caiger | |
| 2010/0000603 A1 | 1/2010 | Tsuzuki | |
| 2010/0006147 A1 | 1/2010 | Nakashima | |
| 2010/0018568 A1 | 1/2010 | Nakata | |
| 2010/0065116 A1* | 3/2010 | Stancel | B32B 27/38 |
| | | | 136/256 |
| 2010/0132762 A1 | 6/2010 | Graham | |
| 2010/0147363 A1 | 6/2010 | Huang | |
| 2010/0147364 A1 | 6/2010 | Gonzalez et al. | |
| 2010/0180929 A1 | 7/2010 | Raymond | |
| 2011/0023937 A1 | 2/2011 | Daniel | |
| 2011/0023942 A1 | 2/2011 | Soegding | |
| 2011/0030761 A1 | 2/2011 | Kalkanoglu | |
| 2011/0277825 A1 | 11/2011 | Fu | |
| 2012/0000502 A1 | 1/2012 | Wiedeman et al. | |
| 2012/0012162 A1 | 1/2012 | Kobayashi | |
| 2012/0031470 A1 | 2/2012 | Dimov | |
| 2012/0048349 A1 | 3/2012 | Metin | |
| 2012/0060911 A1 | 3/2012 | Fu | |
| 2012/0125391 A1 | 5/2012 | Pinarbasi | |
| 2012/0199184 A1 | 8/2012 | Nie | |
| 2012/0237670 A1 | 9/2012 | Lim | |
| 2013/0048062 A1 | 2/2013 | Min | |
| 2013/0061913 A1 | 3/2013 | Willham | |
| 2013/0160823 A1 | 6/2013 | Khouri | |
| 2013/0206213 A1 | 8/2013 | He | |
| 2013/0209776 A1 | 8/2013 | Kim | |
| 2013/0233378 A1 | 9/2013 | Moslehi | |
| 2013/0247959 A1 | 9/2013 | Kwon | |
| 2013/0255755 A1 | 10/2013 | Chich | |
| 2013/0280521 A1 | 10/2013 | Mori | |
| 2014/0120699 A1 | 5/2014 | Hua | |
| 2014/0124014 A1 | 5/2014 | Morad | |
| 2014/0196768 A1 | 7/2014 | Heng et al. | |
| 2014/0313574 A1 | 10/2014 | Bills | |
| 2014/0360582 A1 | 12/2014 | Cui | |
| 2015/0022876 A1 | 1/2015 | Ma et al. | |
| 2015/0090314 A1 | 4/2015 | Yang | |
| 2015/0155824 A1 | 6/2015 | Chien | |
| 2015/0194552 A1 | 7/2015 | Ogasahara | |
| 2015/0243931 A1 | 8/2015 | Fukuura | |
| 2015/0270410 A1 | 9/2015 | Heng | |
| 2015/0349145 A1 | 12/2015 | Morad | |
| 2015/0349152 A1 | 12/2015 | Voss | |
| 2015/0349703 A1 | 12/2015 | Morad | |
| 2016/0013329 A1 | 1/2016 | Brophy | |
| 2016/0020338 A1* | 1/2016 | Beck | H01L 31/02008 |
| | | | 136/256 |
| 2016/0105144 A1 | 4/2016 | Haynes | |
| 2016/0163902 A1 | 6/2016 | Podlowski | |
| 2016/0181446 A1 | 6/2016 | Kalkanoglu | |
| 2016/0225931 A1 | 8/2016 | Heng | |
| 2017/0033250 A1 | 2/2017 | Ballif | |
| 2017/0077343 A1 | 3/2017 | Morad | |
| 2017/0141244 A1 | 5/2017 | Khaled | |
| 2017/0194516 A1 | 7/2017 | Reddy | |
| 2017/0222082 A1 | 8/2017 | Lin | |
| 2018/0115275 A1 | 4/2018 | Flanigan et al. | |
| 2018/0123504 A1 | 5/2018 | Almy et al. | |
| 2018/0166601 A1 | 6/2018 | Inaba | |
| 2018/0337629 A1 | 11/2018 | Liu et al. | |
| 2019/0097571 A1 | 3/2019 | Lefevre et al. | |
| 2021/0044250 A1 | 2/2021 | Liu et al. | |

FOREIGN PATENT DOCUMENTS

| | | |
|---|---|---|
| CN | 102956730 | 6/2016 |
| DE | 102007054124 | 5/2009 |
| EP | 1058320 | 12/2000 |
| EP | 2051124 A2 | 4/2009 |
| EP | 2709160 | 3/2014 |
| GB | 2278618 | 12/1994 |
| GB | 2431773 A | 5/2007 |
| JP | S57141979 | 9/1982 |
| JP | S6020586 | 2/1985 |
| JP | H06140657 | 5/1994 |
| JP | H06264571 | 9/1994 |
| JP | 2000091610 | 3/2000 |
| JP | 2000216415 | 8/2000 |
| JP | 2013211385 | 10/2013 |
| TW | 201039452 A | 11/2010 |
| WO | 2008136872 | 11/2008 |
| WO | 2009062106 | 5/2009 |
| WO | 2009099418 | 8/2009 |
| WO | 2010128375 | 11/2010 |
| WO | 2011128757 | 10/2011 |
| WO | 201359441 | 4/2013 |

(56) References Cited

FOREIGN PATENT DOCUMENTS

| WO | 2013067541 | 5/2013 |
|---|---|---|
| WO | 2013102181 | 7/2013 |
| WO | 2014178180 | 11/2014 |
| WO | 2015155356 | 10/2015 |
| WO | 2016090341 | 6/2016 |
| WO | 2018/158470 A2 | 9/2018 |

OTHER PUBLICATIONS

Final Office Action received for U.S. Appl. No. 15/598,194, dated Jun. 22, 2018, 17 pages.

Final Office Action received for U.S. Appl. No. 15/719,244, dated Feb. 19, 2020, 22 pages.

First Action Interview—Office Action received for U.S. Appl. No. 15/719,244, dated Aug. 20, 2019, 6 pages.

First Action Interview Office Action received for U.S. Appl. No. 15/598,194, dated Feb. 12, 2018, 7 pages.

International Preliminary Report on Patentability received for PCT Patent Application No. PCT/US2018/030492, dated Nov. 28, 2019, 9 pages.

International Search Report and Written Opinion received for PCT Patent Application No. PCT/US2018/030492, dated Jul. 20, 2018, 12 pages.

Notice of Allowance received for U.S. Appl. No. 15/598,194, dated Apr. 3, 2019, 11 pages.

Pre-Interview First Office Action received for U.S. Appl. No. 15/598,194, dated Dec. 21, 2017, 5 pages.

Pre-Interview First Office Action received for U.S. Appl. No. 15/719,244, dated Jun. 13, 2019, 5 pages.

Lin et al., "Fabrication of Antireflective Nanostructures for Crystalline Silicon Solar Cells by Reactive Ion Etching", Thin Solid Films 529, 2013, pp. 138-142.

Bulucani et al., "A new approach: low cost masking material and efficient copper metallization for higher efficiency silicon solar cells" 2015 IEEE.

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

"Recovery Act: Organic Coatings as Encapsulants for Low Cost, High Performance PV Modules" Jim Poole et al. Nov. 16, 2011.

Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.

International Search Report and Written Opinion received for PCT Patent Application No. PCT/US2020/044790, dated Feb. 3, 2021, 19 pages.

Invitation to Pay Additional fees received for PCT Patent Application No. PCT/US2020/044790, mailed on Nov. 5, 2020, 9 pages.

Non-Final Office Action received for U.S. Appl. No. 16/533,524, dated Sep. 3, 2020, 16 pages.

Notice of Allowance received for U.S. Appl. No. 15/719,244, dated Dec. 11, 2020, 11 pages.

\* cited by examiner

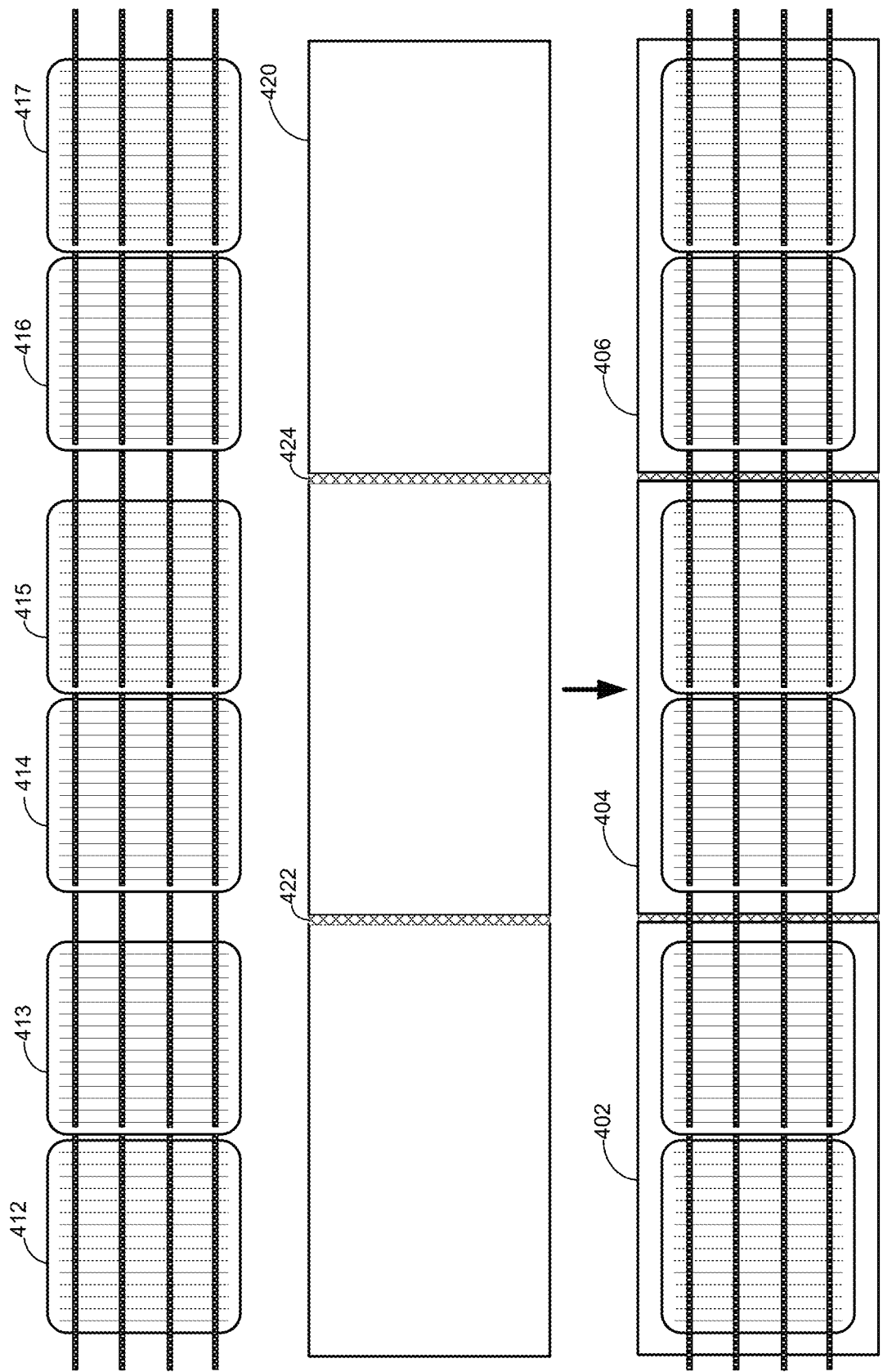

SOLAR ROOF TILE WITH A UNIFORM APPEARANCE

BACKGROUND

Field

This disclosure is generally related to photovoltaic (or "PV") roof tiles. More specifically, this disclosure is related to a photovoltaic roof tile that has a uniform color appearance.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically encloses fewer solar cells than a conventional solar panel.

The front and back covers can be fortified glass or other material that can protect the PV cells from the weather elements. To ensure sufficient transmission of sunlight, the front cover needs to be transparent, whereas the encapsulated photovoltaic structures are often dark colored. When viewed from a shallow angle (e.g., when the roof is viewed from the street), the dark-colored photovoltaic structures can become visible. The color contrast between the photovoltaic structures and the glass cover can create a scene that is not aesthetically pleasing.

SUMMARY

One embodiment can provide a photovoltaic roof tile. The photovoltaic roof tile can include a transparent front cover, a back cover, a plurality of photovoltaic structures positioned between the front cover and the back cover, and a front-cover-colorant layer positioned on an interior surface of the transparent front cover that faces a top surface of the photovoltaic structures. A color of the front-cover-colorant layer can substantially match a color of the top surface of the photovoltaic structures, and the front-cover-colorant layer can be configured to cover regions of the interior surface that are not directly above the top surface of the photovoltaic structures, thereby enabling a substantially uniform appearance of the photovoltaic roof tile.

In a variation on this embodiment, a respective photovoltaic structure can include a first edge busbar positioned near an edge of a first surface and a second edge busbar positioned near an opposite edge of a second surface, and the plurality of photovoltaic structures can be arranged in such a way that the first edge busbar of a first photovoltaic structure overlaps the second edge busbar of an adjacent photovoltaic structure, thereby resulting in the plurality of photovoltaic structures forming a serially coupled string.

In a further variation, the photovoltaic roof tile can further include an external conductive connector coupled to an exposed edge busbar of the serially coupled string.

In a further variation, the external conductive connector can be positioned beneath the front-cover-colorant layer, thus being out of sight when viewed from outside of the transparent front cover.

In a variation on this embodiment, the transparent front cover can include glass.

In a further variation, the front-cover-colorant layer can include a layer of glass frit.

In a further variation, the interior surface of the transparent glass cover can be textured.

In a variation on this embodiment, the back cover can include glass, and the photovoltaic roof tile can further include a back-cover-colorant layer positioned on a surface of the back cover.

In a further variation, the back-cover-colorant layer can be configured to completely cover the surface of the back cover.

In a further variation, the back-cover-colorant layer can be configured to cover border regions of the surface of the back cover.

One embodiment can provide a method for fabricating a photovoltaic roof tile. The fabrication method can include obtaining a front cover and a back cover, forming a cascaded string of photovoltaic structures, and laminating the cascaded string of photovoltaic structures between the front cover and the back cover. The front cover can include a transparent glass sheet and a front-cover-colorant layer positioned on an interior surface of the front cover. A color of the front-cover-colorant layer can substantially match a color of a top surface of the cascaded string, and the front-cover-colorant layer can be configured to cover regions of the interior surface that are not directly above the top surface of the cascaded string, thereby enabling a substantially uniform appearance of the photovoltaic roof tile.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

FIG. 4A illustrates an exemplary configuration of a multi-tile module, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the invention solve at least the technical problem of color management of solar roof tiles. A solar roof tile can include a string of cascaded photovoltaic strips sandwiched between a front glass cover and a back cover. In addition, stamped electrodes can be attached to either ends of the string, facilitating inter-tile electrical connections. The cascaded string and the stamped electrodes can have a different color appearance compared to the remaining portion of a solar roof tile. To mitigate the color contrast, in some embodiments, a colorant (e.g., a layer of glass frit) can be applied onto the top cover of the solar roof tile, at locations that do not block sunlight absorption by the photovoltaic structures.

PV Roof Tiles and Multi-Tile Modules

A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. Provisional Patent Application No. 62/465,694, entitled "SYSTEM AND METHOD FOR PACKAGING PHOTOVOLTAIC ROOF TILES" filed Mar. 1, 2017, which is incorporated herein by reference. In some embodiments, the system disclosed herein can be applied to PV roof tiles and/or other types of PV module.

Figure 1:
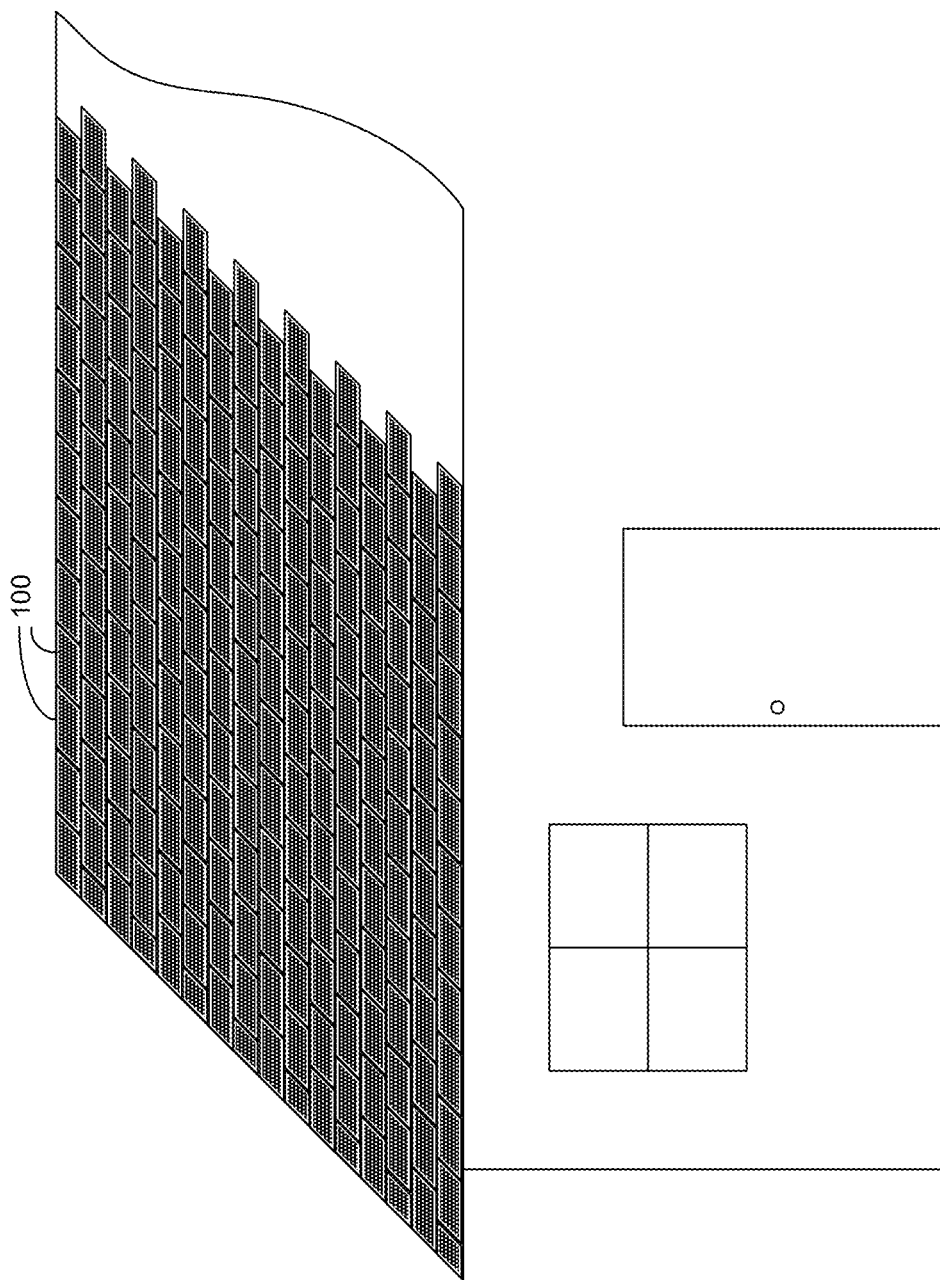
FIG. 1 shows an exemplary configuration of PV roof tiles on a house.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, and a respective PV structure can include one or more electrodes, such as busbars and finger lines. The PV structures within a PV roof tile can be electrically and, optionally, mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2:
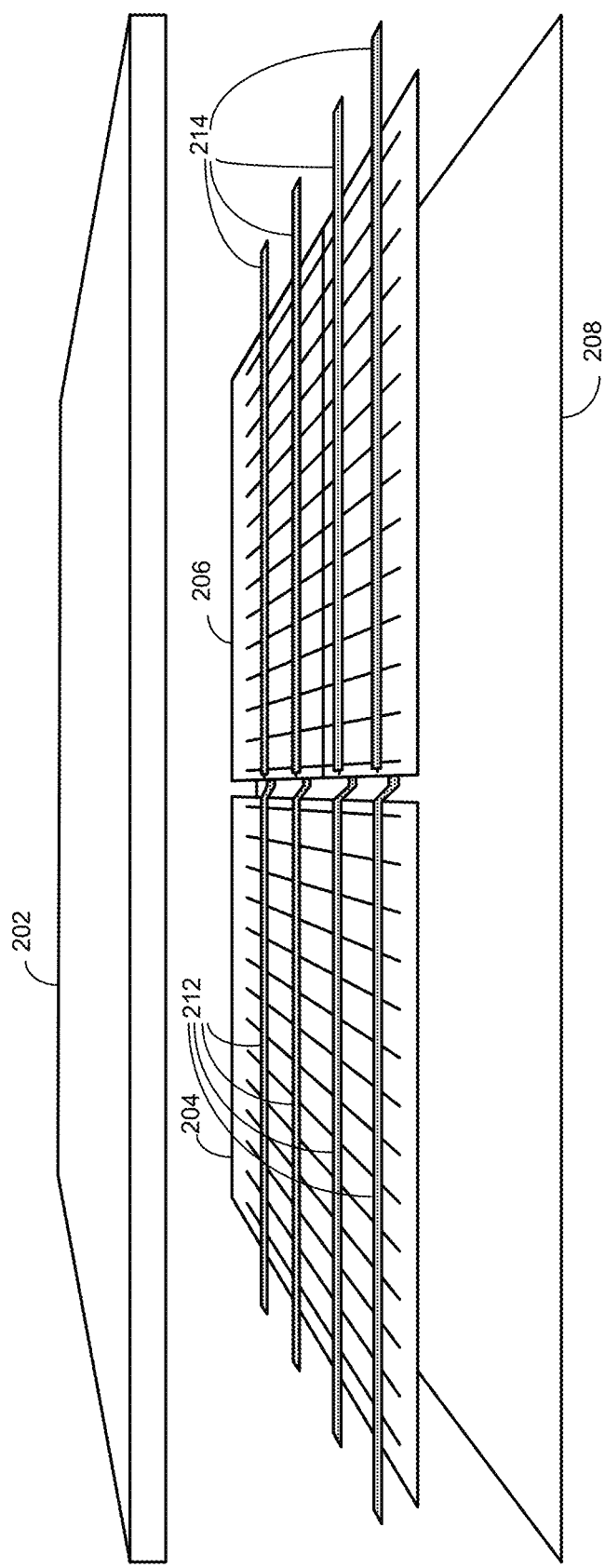
FIG. 2 shows the perspective view of an exemplary photovoltaic roof tile, according to an embodiment.

FIG. 2 shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2, metallic tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back of solar cell 206, creating a serial connection between solar cell 204 and solar cell 206. On the other hand, tabbing strips 214 can be in contact with front-side electrodes of solar cell 206 and extend beyond the right edge of glass cover 202, serving as contact electrodes of a second polarity of the PV roof tile.

Figure 3:
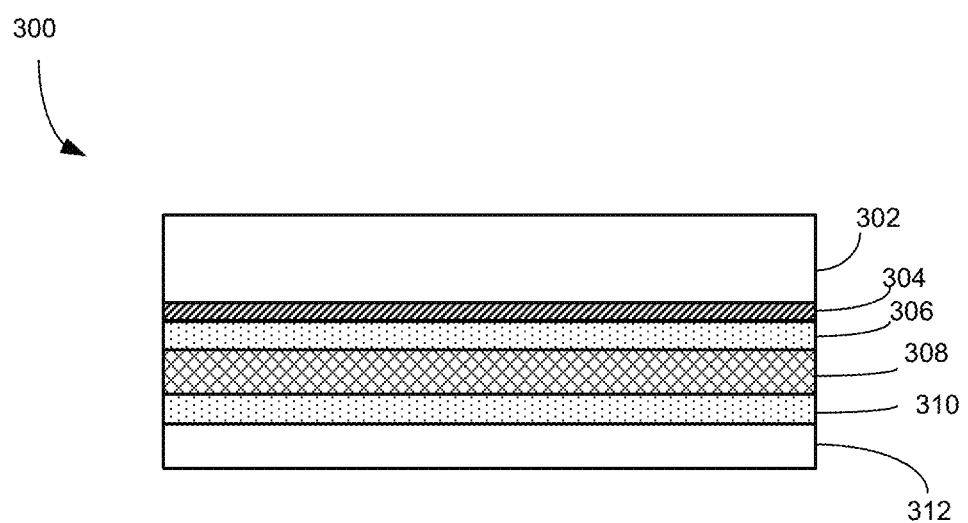
FIG. 3 shows a cross-section of an exemplary photovoltaic roof tile, according to an embodiment.

FIG. 3 shows a cross-section of an exemplary photovoltaic roof tile, according to an embodiment. Solar cell or array of solar cells 308 can be encapsulated between top glass cover 302 and back cover 312, which can be fortified glass or a regular PV backsheet. Top encapsulant layer 306, which can be based on a polymer, can be used to seal top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal array of solar cells 308 and back cover 312. A PV roof tile can also contain other optional layers, such as an optical filter or coating layer or a layer of nanoparticles for providing desired color appearances. In the example of FIG. 3, module or roof tile 300 also contains an optical filter layer 304.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common backsheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity in roof installation, because the tiles within the module have been connected with the tabbing strips. Note that the number of tiles included in each multi-tile module can be more or fewer than what is shown in FIG. 4A.

Figure 4B:
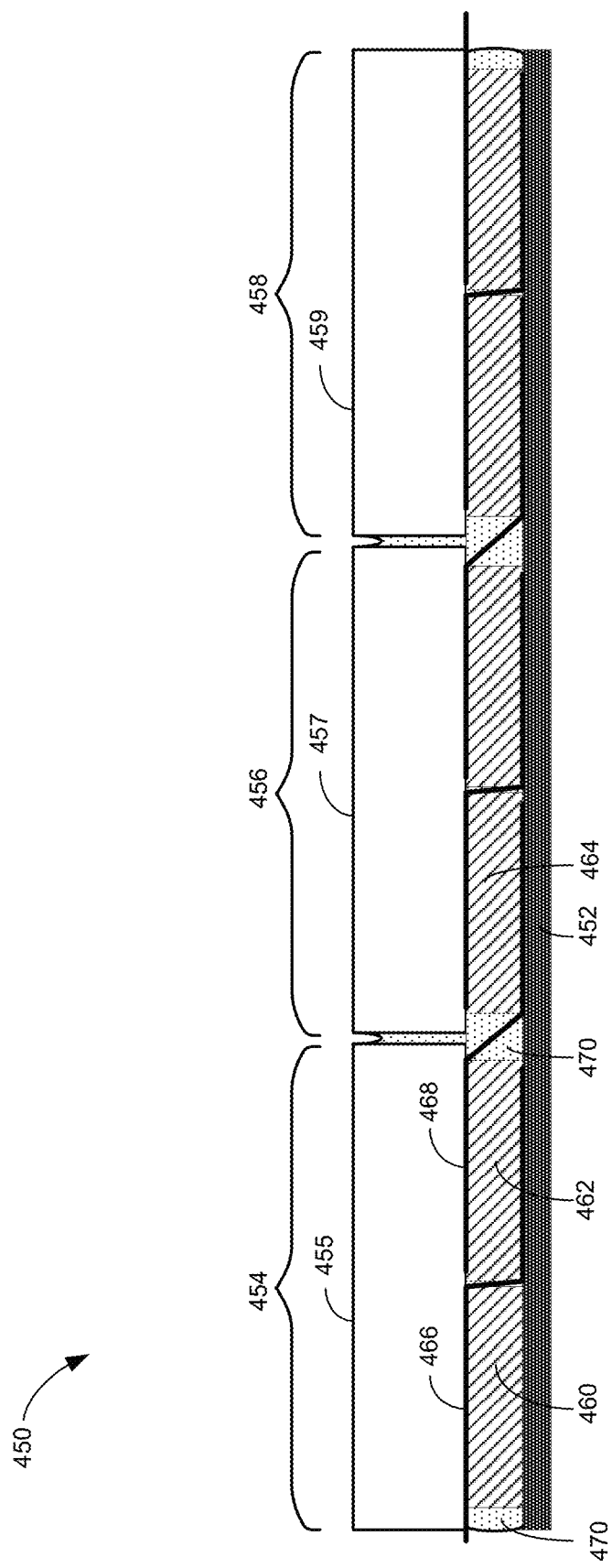
FIG. 4B illustrates a cross-section of an exemplary multi-tile module, according to one embodiment.

FIG. 4B illustrates a cross-section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells. For example, tile 454 can include solar cells 460 and 462 encapsulated between backsheet 452 and glass cover 455. Tabbing strips can be used to provide electrical coupling within each tile and between adjacent tiles. For example, tabbing strip 466 can couple the front electrode of solar cell 460 to the back electrode of solar cell 462, creating a serial connection between these two cells. Similarly, tabbing strip 468 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 468 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles.

In addition to the examples shown in FIGS. 4A and 4B, a PV tile may include different forms of photovoltaic structures. For example, in order to reduce internal resistance, each square solar cell shown in FIG. 4A can be divided into multiple (e.g., three) smaller strips, each having edge busbars of different polarities on its two opposite edges. The edge busbars allow the strips to be cascaded one by one to form a serially connected string.

Figure 5A:
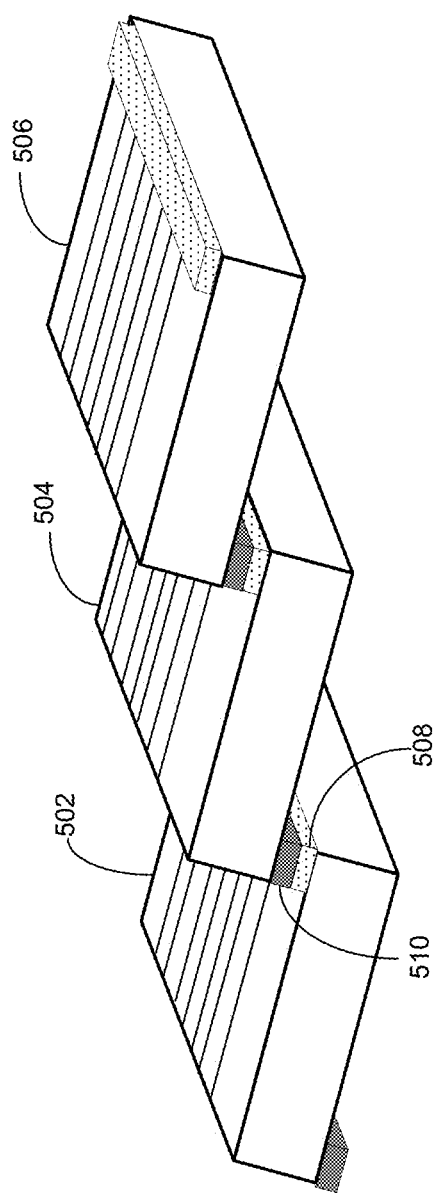
FIG. 5A illustrates a serial connection between three adjacent cascaded photovoltaic strips, according to one embodiment.

FIG. 5A illustrates a serial connection between three adjacent cascaded photovoltaic strips, according to one embodiment. In FIG. 5A, strips 502, 504, and 506 are stacked in such a way that strip 504 partially underlaps adjacent strip 506 to its right, and overlaps strip 502 to its left. The resulting string of strips forms a cascaded pattern similar to roof shingles. Strips 502 and 504 are electrically coupled in series via edge busbar 508 at the top surface of strip 502 and edge busbar 510 at the bottom surface of strip 504. Strips 502 and 504 can be arranged in such a way that bottom edge busbar 510 is above and in direct contact with top edge busbar 508. The coupling between strips 504 and 506 can be similar.

Figure 5B:
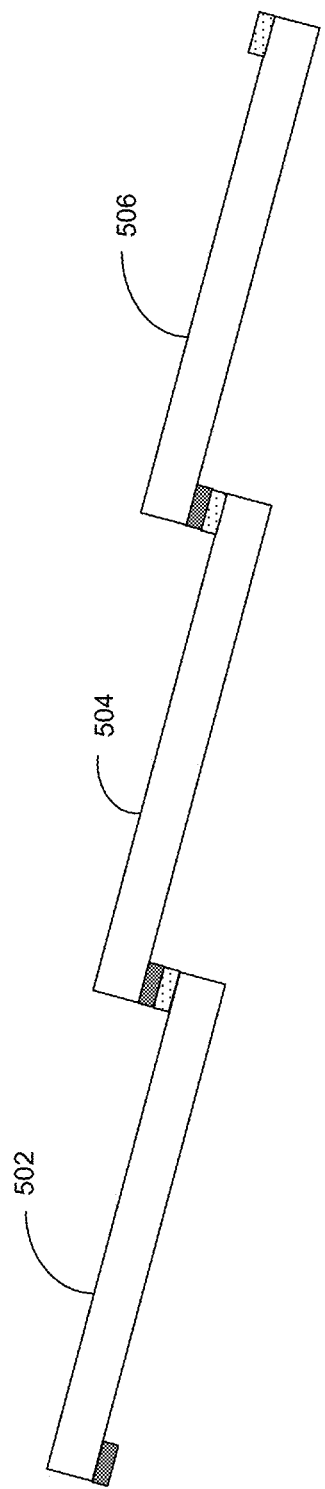
FIG. 5B illustrates the side view of the string of cascaded strips, according to one embodiment.

FIG. 5B illustrates the side view of the string of cascaded strips, according to one embodiment. In the example shown in FIGS. 5A and 5B, the strips can be segments of a six-inch square or pseudo-square solar cell, with each strip having a dimension of approximately two inches by six inches. To reduce shading, the overlapping between adjacent strips should be kept as small as possible. Therefore, in the example shown in FIGS. 5A and 5B, the single busbars (both at the top and the bottom surfaces) can be placed at or near the very edge of the strip. The same cascaded pattern can extend along multiple strips to form a serially connected string, and a number of strings can be coupled in series or parallel.

Figure 5C:
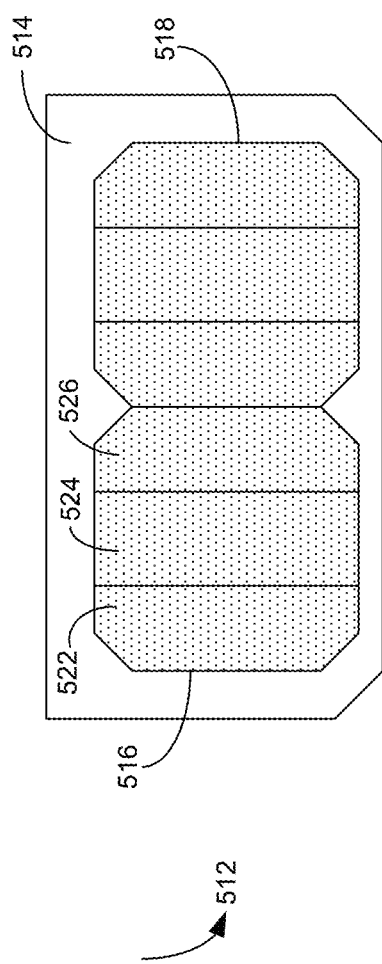
FIG. 5C illustrates an exemplary solar roof tile, according to one embodiment.

FIG. 5C illustrates an exemplary solar roof tile, according to one embodiment. A solar roof tile 512 includes top glass cover 514 and solar cells 516 and 518. The bottom cover (e.g., backsheet) of solar roof tile 512 is out of view in FIG. 5C. Solar cells 516 and 518 can be conventional square or pseudo-square solar cells, such as six-inch solar cells. In some embodiments, solar cells 516 and 518 can each be divided into three separate pieces of similar size. For example, solar cell 516 can include strips 522, 524, and 526. These strips can be arranged in such a way that adjacent strips are partially overlapped at the edges, similar to the ones shown in FIGS. 5A-5B. For simplicity of illustration, the electrode grids, including the finger lines and edge busbars, of the strips are not shown in FIG. 5C. In addition to the example shown in FIG. 5C, a solar roof tile can contain fewer or more cascaded strips, which can be of various shapes and size.

Figure 6A:
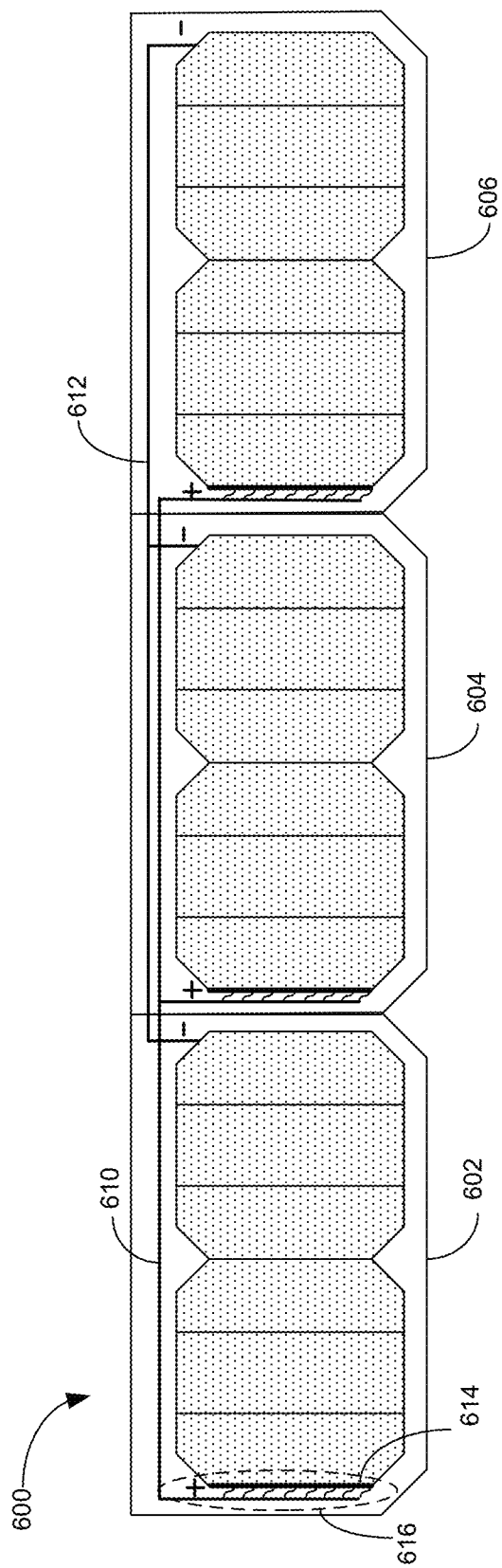
FIG. 6A shows the top view of an exemplary multi-tile module, according to one embodiment.

FIG. 6A shows the top view of an exemplary multi-tile module, according to one embodiment. Multi-tile module 600 can include PV roof tiles 602, 604, and 606 arranged side by side. Each PV roof tile can include six cascaded strips encapsulated between the front and back covers, meaning that busbars located at opposite edges of the cascaded string of strips have opposite polarities. For example, if the leftmost edge busbar of the strips in PV roof tile 602 has a positive polarity, then the rightmost edge busbar of the strips will have a negative polarity. Serial connections can be established among the tiles by electrically coupling busbars having opposite polarities, whereas parallel connections can be established among the tiles by electrically coupling busbars having the same polarity.

In the example shown in FIG. 6A, the PV roof tiles are arranged in such a way that their sun-facing sides have the same electrical polarity. As a result, the edge busbars of the same polarity will be on the same left or right edge. For example, the leftmost edge busbar of all PV roof tiles can have a positive polarity and the rightmost edge busbar of all PV roof tiles can have a negative polarity, or vice versa. In FIG. 6A, the left edge busbars of all strips have a positive polarity (indicated by the "+" signs) and are located on the sun-facing (or front) surface of the strips, whereas the right edge busbars of all strips have a negative polarity (indicated by the "−" signs) and are located on the back surface. Depending on the design of the layer structure of the solar cell, the polarity and location of the edge busbars can be different from those shown in FIG. 6A.

A parallel connection among the tiles can be formed by electrically coupling all leftmost busbars together via metal tab 610 and all rightmost busbars together via metal tab 612.

Metal tabs 610 and 612 are also known as connection buses and typically can be used for interconnecting individual solar cells or strings. A metal tab can be stamped, cut, or otherwise formed from conductive material, such as copper. Copper is a highly conductive and relatively low-cost connector material. However, other conductive materials such as silver, gold, or aluminum can be used. In particular, silver or gold can be used as a coating material to prevent oxidation of copper or aluminum. In some embodiments, alloys that have been heat-treated to have super-elastic properties can be used for all or part of the metal tab. Suitable alloys may include, for example, copper-zinc-aluminum (CuZnAl), copper-aluminum-nickel (CuAlNi), or copper-aluminum-beryllium (CuAlBe). In addition, the material of the metal tabs disclosed herein can be manipulated in whole or in part to alter mechanical properties. For example, all or part of metal tabs 610 and 612 can be forged (e.g., to increase strength), annealed (e.g., to increase ductility), and/or tempered (e.g. to increase surface hardness).

The coupling between a metal tab and a busbar can be facilitated by a specially designed strain-relief connector. In FIG. 6A, strain-relief connector 616 can be used to couple busbar 614 and metal tab 610. Such strain-relief connectors are needed due to the mismatch of the thermal expansion coefficients between metal (e.g., Cu) and silicon. As shown in FIG. 6A, the metal tabs (e.g., tabs 610 and 612) may cross paths with strain-relief connectors of opposite polarities. To prevent an electrical short of the photovoltaic strips, portions of the metal tabs and/or strain-relief connectors can be coated with an insulation film or wrapped with a sheet of insulation material.

Figure 6B:
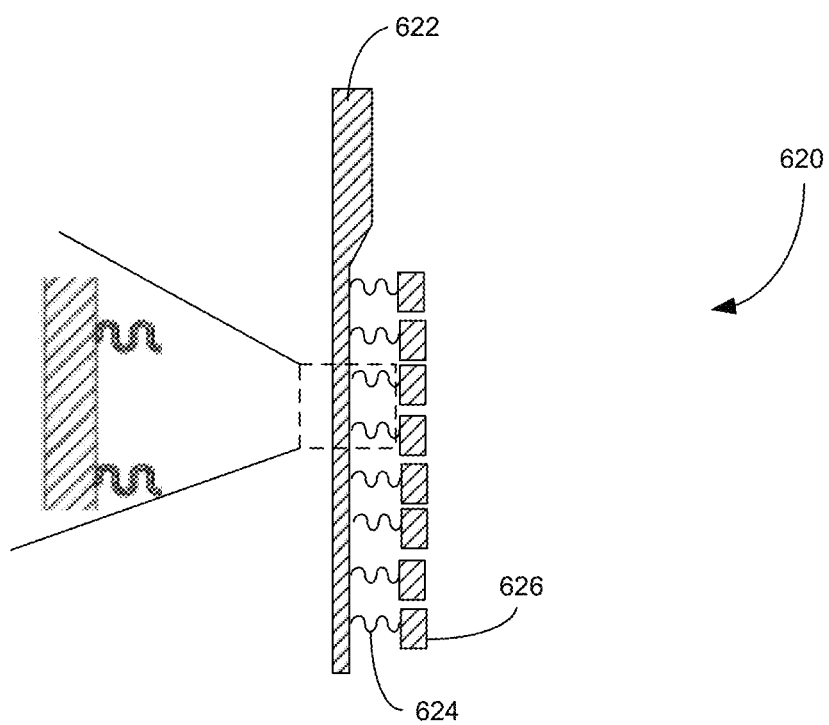
FIG. 6B shows a detailed view of an exemplary strain-relief connector, according to one embodiment.

FIG. 6B shows a detailed view of an exemplary strain-relief connector, according to one embodiment. In FIG. 6B, strain-relief connector 620 can include elongated connection member 622, a number of curved metal wires (e.g., curved metal wire 624), and a number of connection pads (e.g., connection pad 626). The connection pads can be used to couple strain-relief connector 620 to a corresponding edge busbar. Elongated connection member 622 can extend along a direction substantially parallel to the to-be-coupled busbar of a photovoltaic structure. The curved metal wires can extend laterally from elongated connection member 622 in a non-linear manner (i.e., having non-linear geometry), as shown by the amplified view. Non-linear geometry can include paths that centrally follow a curved wire (e.g., a path that extends along a series of centermost points located between outermost edges) or along any face or edge of the wire. A curved wire having non-linear geometry can have, but does not require, symmetry along the path of elongation. For example, one edge, or portion of an edge, of a curved wire can be straight and an opposite edge can include one or more curves, cuts, or extensions. Curved wires having non-linear geometry can include straight portions before, after, and/or between non-linear portions. Non-linear geometry can include propagating paths that extend laterally along a first axis (e.g., X axis) while alternating direction in negative and positive directions of one or more other axes (e.g., Y axis and/or Z axis) that are perpendicular to the first axis, in a repetitive manner, such as a sine wave or helix. While the curved wires disclosed herein use curved profiles, non-linear geometry can be constructed from a series of straight lines; for example, propagating shapes, such as square or sawtooth waves, can form non-linear geometry. These curved wires can relieve the strain generated due to the mismatch of thermal expansion coefficients between the metal connector and the Si-based photovoltaic structure.

In some embodiments, each curved metal wire can be attached to a connection pad. For example, curved metal wire 624 can be attached to connection pad 626. In alternative embodiments, more than one (e.g., two or three) curved wires can be attached to a connection pad. The elongated connection member 622, the curved wires, and the connection pads can be formed (e.g., stamped or cut) from a single piece of material, or they can be attached to each other by any suitable electrical connection, such as by soldering, welding, or bonding. A more detailed description of such strain-relief connectors and the coupling between the strain-relief connectors and the edge busbars can be found in U.S. patent application Ser. No. 15/900,600, filed Feb. 20, 2018, and entitled "METHOD FOR ATTACHING CONNECTOR TO SOLAR CELL ELECTRODES IN A SOLAR ROOF TILE," the disclosure of which is incorporated herein by reference in its entirety.

Figure 6C:
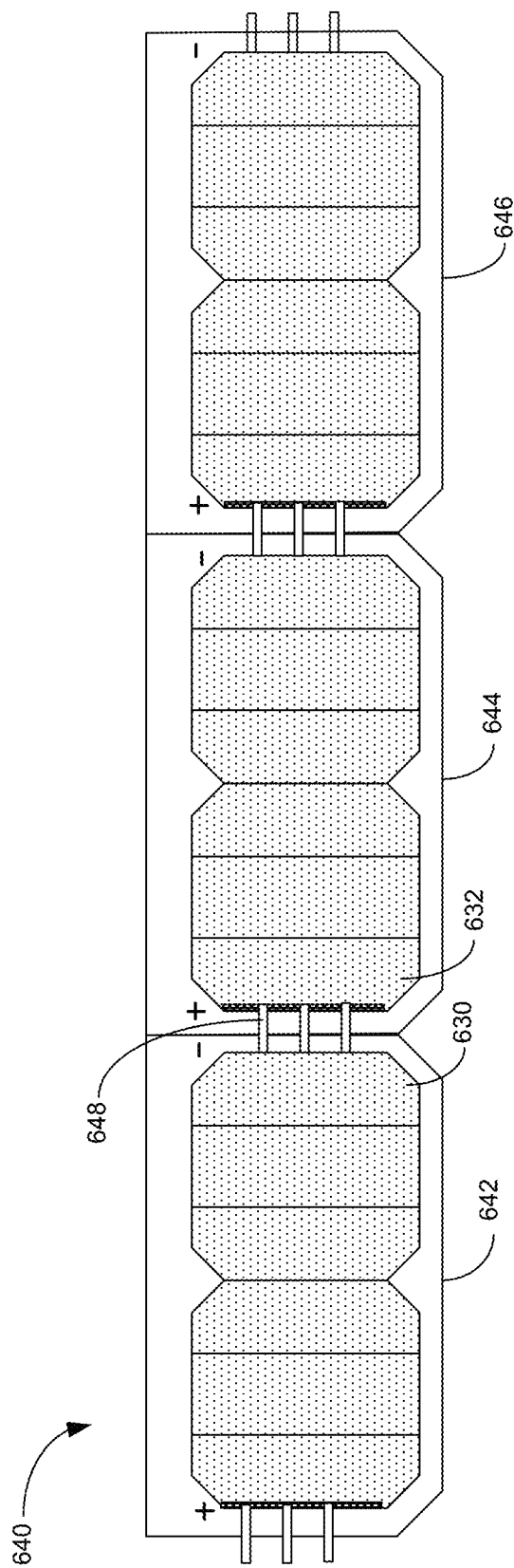
FIG. 6C shows the top view of an exemplary multi-tile module, according to one embodiment.

In some embodiments, instead of parallelly coupling the tiles within a tile module using stamped metal tabs and strain-relief connectors as shown in FIG. 6A, one can also form serial coupling among the tiles. FIG. 6C shows the top view of an exemplary multi-tile module, according to one embodiment. Tile module 640 can include solar roof tiles 642, 644, and 646.

Each tile can include a number (e.g., six) of cascaded solar cell strips arranged in a manner shown in FIGS. 2A and 2B. Furthermore, metal tabs can be used to interconnect photovoltaic strips enclosed in adjacent tiles. For example, metal tab 648 can connect the front of strip 632 with the back of strip 630, creating a serial coupling between strips 630 and 632. Although the example in FIG. 6C shows three metal tabs interconnecting the photovoltaic strips, other numbers of metal tabs can also be used. Furthermore, each solar roof tile can contain fewer or more cascaded strips, which can be of various shapes and sizes.

For simplicity of illustration, FIGS. 6A and 6C do not show the inter-tile spacers that provide support and facilitate mechanical and electrical coupling between adjacent tiles. Detailed descriptions of such inter-tile spacers can be found in U.S. patent application Ser. No. 15/900,636, filed Feb. 20, 2018, and entitled "INTER-TILE SUPPORT FOR SOLAR ROOF TILES," the disclosure of which is incorporated herein by reference in its entirety.

Color Matching in Solar Roof Tiles

As shown in FIG. 5C, FIG. 6A, and FIG. 6C, the photovoltaic structures and external electrodes encapsulated between the front and back covers can appear different than the background when viewed from the side of the transparent and colorless front cover. More specifically, the Si-based photovoltaic structures often appear to have a blue/purple hue. Although applying color onto the back cover can improve the color matching between the photovoltaic structures and the background, they cannot solve the problem of angle-dependence of color. In other words, the photovoltaic structures may appear to have different colors at different viewing angles, making color-matching difficult. Moreover, apart from solar roof tiles, a roof can sometimes include a certain number of "passive" or "dead" roof tiles, i.e., roof tiles that do not have embedded solar cells. These passive roof tiles can merely include the front and back covers and encapsulant sandwiched between the covers. The difference in appearance between the solar roof tiles and the passive roof tiles often results in a less pleasing aesthetic.

Figure 7:
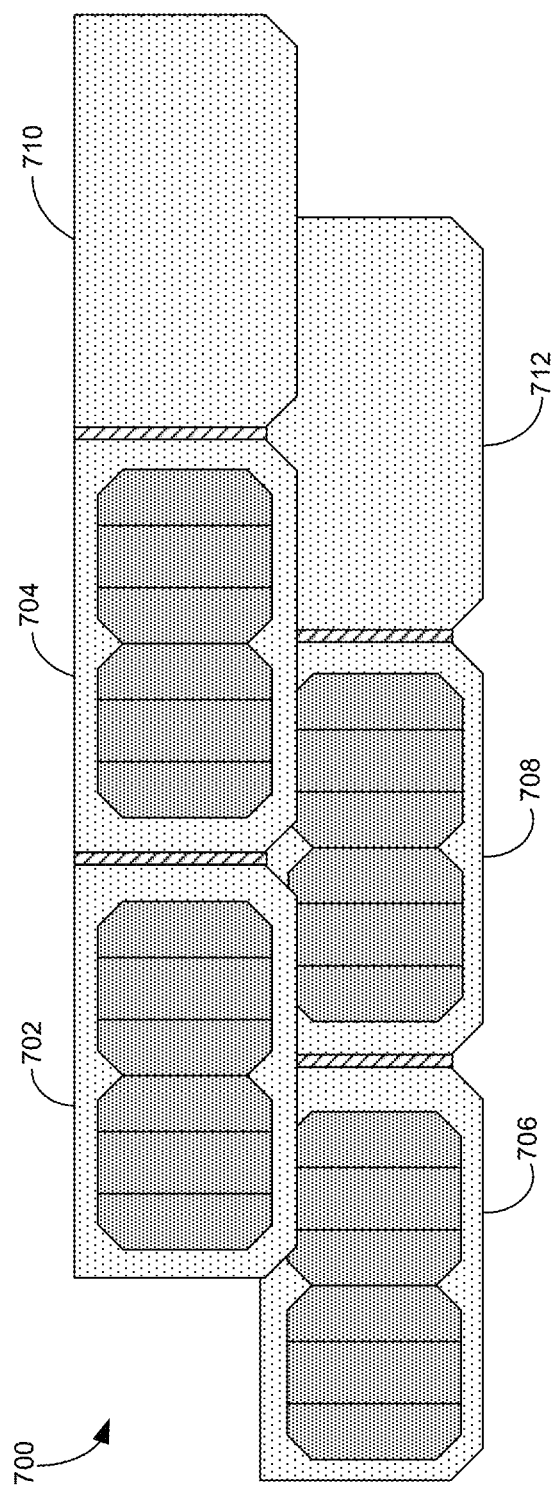
FIG. 7 shows a partial view of a roof having a number of solar roof tiles and passive roof tiles.

FIG. 7 shows a partial view of a roof having a number of solar roof tiles and passive roof tiles. In FIG. 7, roof 700 can include a number of roof tiles arranged in such a fashion that the lower edges of tiles in a top row overlap the upper edges of tiles in a bottom row, thus preventing water leakage. Moreover, the tiles are offset in such a manner that the gap between adjacent tiles in one row somewhat aligns with the center of a tile located in a different row. In the example shown in FIG. 7, tiles 702, 704, 706, and 708 are solar roof tiles, which can include photovoltaic structures encapsulated between front and back covers, and tiles 710 and 712 are passive roof tiles. As one can see from the drawing, the color contrast between the back covers and the photovoltaic structures can create a "picture frame" appearance of the solar roof tiles. In fact, the photovoltaic structures often appear to be "floating" above the colored back covers. Ideally, solar roof tiles 702-708 should have a similar appearance as passive roof tiles 710 and 712.

Various techniques have been developed to manipulate the transmission and/or reflection spectrum in order to allow the photovoltaic structures to appear similar in color as the background. For example, optical filters (e.g., optical filter 304 shown in FIG. 3) can be applied to remove bluish or purple light reflected by the encapsulated photovoltaic structures. Another approach can involve depositing a layer of nanoparticles onto the interior surface of the front cover in order to absorb the blue/purple light reflected by the encapsulated photovoltaic structures. However, all these techniques often inevitably lead to reduction in the amount of light absorbed by the photovoltaic structures, thus reducing the solar cell efficiency. Moreover, applying the optical filters or nanoparticles can add to additional fabrication complexity and cost.

To overcome this problem, in some embodiments, a colorant layer with a matching color of the photovoltaic structures can be pre-deposited onto the front cover of a solar roof tile. More specifically, the colorant layer can be applied at locations that do not block incident light to the photovoltaic structures. In other words, this colorant layer can mask the background as well as the external electrodes without interference with absorption of light by the photovoltaic structures.

Figure 8A:
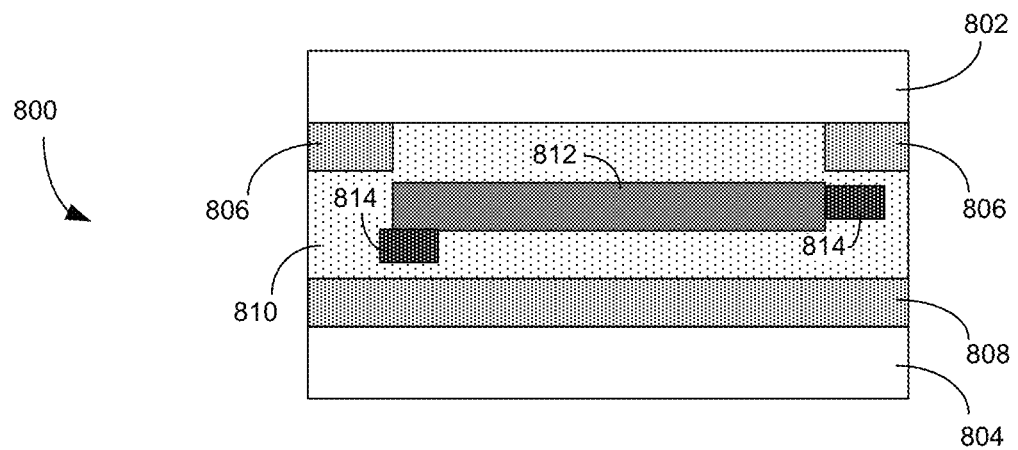
FIG. 8A shows a cross-section of an exemplary photovoltaic roof tile, according to an embodiment.

FIG. 8A shows a cross-section of an exemplary photovoltaic roof tile, according to an embodiment. Solar roof tile 800 can include front cover 802 and back cover 804. Front cover 802 can be made of tempered glass. In some embodiments, the thickness of front cover 802 can be between 2 and 3 mm (e.g., around 2.7 mm), and it can include a textured surface. In further embodiments, the interior surface (i.e., the surface facing the cascaded string) of front cover 802 can be textured, whereas the exterior surface of front cover 802 can remain smooth. Texturing the interior surface of front cover 802 can not only improve the adhesion between front cover 802 and encapsulant 810 but also improve the color uniformity of the entire roof tile. The textured surface of front cover 802 can include an array of three-dimensional (3D) features, and each of the 3D features can have a feature size ranging from 10 μm to 5 mm. In various embodiments, the 3D features can be configured to be either upright or inverted. The shape of the 3D features forming the textured structure can include, but are not limited to, grooves, cones, pyramids with triangle, square or hexagonal bases. In some embodiments, the 3D features can be arranged to form a louver, with each 3D feature having a substantially vertical surface. The textured surface of front cover 802 can be manufactured using a texture roller process and/or a chemical etching process followed by a tempering process. Alternatively, the textured surface can be formed by laminating a louver film onto the interior surface of front cover 802. The exterior surface of front cover 802 can be smooth. Alternatively, the exterior surface can be frosted in order to increase color uniformity or to achieve a certain aesthetic effect. Back cover 804 can be made of tempered glass or PV backsheet materials. In some embodiments, back cover 804 can be made of glass and have smooth surfaces. Alternatively, the interior surface (i.e., the surface facing the cascaded string) of back cover 804 can be textured.

A front-cover-colorant layer 806 can be deposited along the border region of the interior surface of front cover 802 and a back-cover-colorant layer 808 can be deposited on the interior surface of back cover 804. In some embodiments, front-cover-colorant layer 806 and back-cover-colorant layer 808 can include similar materials and have similar colors. In some embodiments, the colorant layers can include a glass frit layer having a thickness of a few tens of microns (e.g., between 10 and 30 microns). The glass frit layer can be screen printed onto the interior surface of front cover 802. Alternatively, front-cover-colorant layer 806 can include a glass frit layer, whereas back-cover-colorant layer 808 can include a layer of acrylic paint, which can be spray painted onto the interior surface of back cover 804. In the example shown in FIG. 8A, back-cover-colorant layer 808 is deposited onto the interior surface of back cover 804. In an alternative embodiment, it is also possible to deposit a back-cover-colorant layer onto the exterior surface of the back cover of the solar roof tile.

Solar roof tile 800 can further include encapsulant 810 sandwiched between front and back covers 802 and 804, respectively. A cascaded string of photovoltaic structures (i.e., string 812) and its external electrodes 814 can be embedded within encapsulant 810.

As seen in FIG. 8A, non-transparent or opaque front-cover-colorant layer 806 only covers the border region of front cover 802, and cascaded string 812 can be arranged in such a way that it is located directly below the uncovered portion of front cover 802. More specifically, front-cover-colorant layer 806 can be configured to cover regions of the interior surface of front cover 802 that are not directly positioned above cascaded string 812. This can ensure that the opaque front-cover-colorant layer 806 does not block any incident sunlight to cascaded string 812. Note that encapsulant 810 is transparent and does not interfere with light absorption by cascaded string 812. On the other hand, external electrodes 814 can be masked by opaque front-cover-colorant layer 806.

Figure 8B:
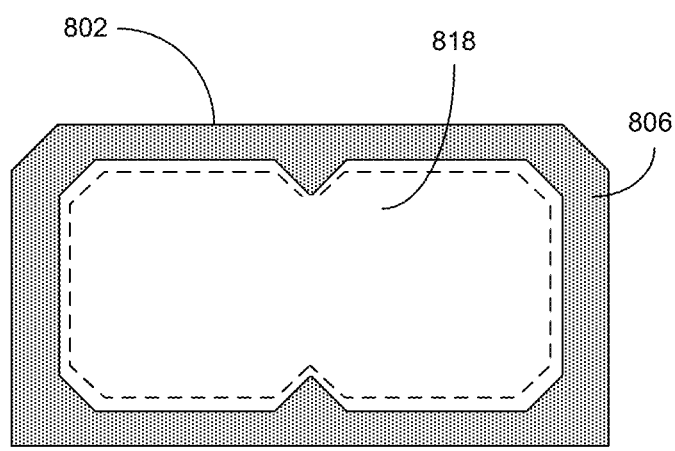
FIG. 8B shows the bottom view of a front cover and a front-cover-colorant layer, according to one embodiment.

FIG. 8B shows the bottom view of front cover 802 and front-cover-colorant layer 806, according to one embodiment. More specifically, when viewed from the bottom (i.e., the side facing away from the sun), front-cover-colorant layer 806 covers the border region of front cover 802, creating a bezel. An opening 818 allows sunlight to shine through front cover 802 to reach the encapsulated cascaded string of photovoltaic structures. In some embodiments, opening 818 can be slightly larger than the encapsulated cascaded string. For example, a small gap (e.g., a gap of a few millimeters) can be created between the edge of the bezel and the edge of the cascaded string. The dashed lines in FIG. 8B indicate the position of the cascaded string encapsulated between the front and back covers of the solar roof tile. Such gaps can provide manufacture tolerance, thus preventing any shading to the cascaded string caused by the bezel.

In the example shown in FIG. 8A, back-cover-colorant layer 808 covers the entire surface of back cover 804. In practice, back-cover-colorant layer 808 can also only cover the border region of back cover 804, thus allowing the cascaded string to be viewed from the back (i.e., the side facing away from the sun) of the tile. This design can make it possible to perform visual inspection of the fabricated roof tile.

Figure 9A:
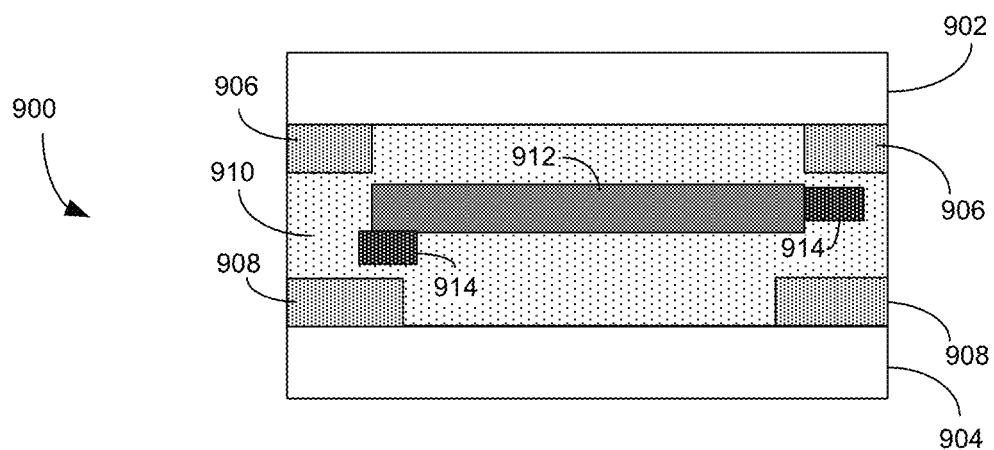
FIG. 9A shows a cross-section of an exemplary photovoltaic roof tile, according to an embodiment.

FIG. 9A shows a cross-section of an exemplary photovoltaic roof tile, according to an embodiment. Solar roof tile 900 can include front cover 902, back cover 904, and encapsulant 910 sandwiched between front cover 902 and back cover 904. Cascaded photovoltaic string 912 and its external electrodes 914 are embedded within encapsulant 910. Front-cover-colorant layer 906 is deposited on the interior surface of front cover 902, covering the border region of front cover 902. Front-cover-colorant layer 906 can be similar to front-cover-colorant layer 806 shown in FIG. 8A.

Solar roof tile 900 can also include a back-cover-colorant layer 908. Unlike back-cover-colorant layer 808 shown in FIG. 8A that completely covers the back cover, back-cover-colorant layer 908 covers only the border region of back cover 904. More specifically, back-cover-colorant layer 908 can be designed in such a way that it allows cascaded string 912 and encapsulant 910 to be seen through transparent back cover 904. This way one can perform visual inspection of a fabricated solar roof. For example, if cascaded string 912 is cracked or bubbles are formed in encapsulant 910, a simple visual inspection can identify such faults without needing to perform more sophisticated testing.

Figure 9B:
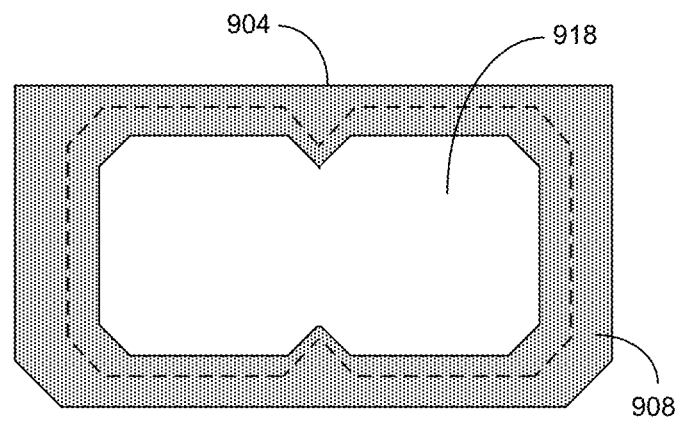
FIG. 9B shows the top view of a back cover and a back-cover-colorant layer, according to one embodiment.

As discussed previously, gaps can exist between the edges of front-cover-colorant layer 906 and the edges of cascaded string 912; to visually hide such gaps, back-cover-colorant layer 908 may extend beyond the edges of cascaded string 912. FIG. 9B shows the top view of back cover 904 and back-cover-colorant layer 908, according to one embodiment. Similar to what's shown in FIG. 8B, back-cover-colorant layer 908 covers the border region of back cover 904, creating a back side bezel. An opening 918 allows visual inspection of the cascaded string encapsulated between the front and back covers of a solar roof tile. To visually hide gaps between the front side bezel and the cascaded string, in some embodiments, the back side bezel can be designed in such a way that opening 918 can be slightly smaller than the cascaded string. In FIG. 9B, the dashed lines indicate the position of the cascaded string encapsulated between the front and back covers of the solar roof tile.

Figure 9C:
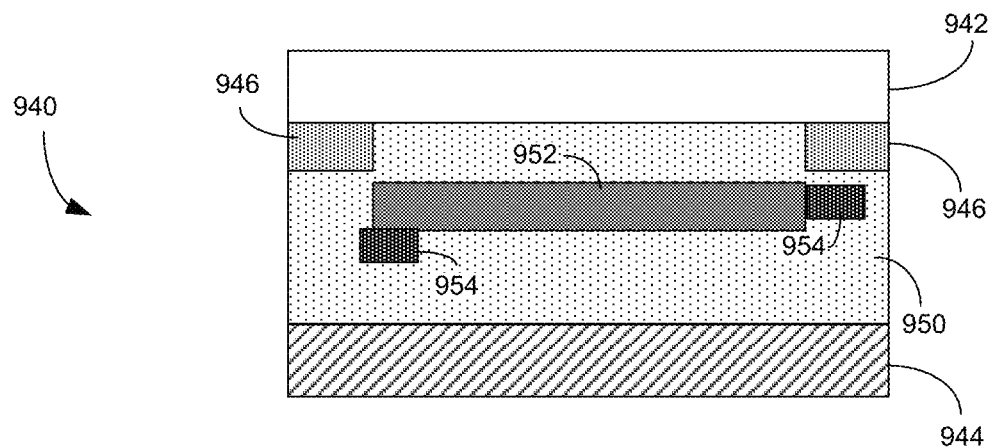
FIG. 9C shows a cross-section of an exemplary photovoltaic roof tile, according to an embodiment.

In some embodiments, the back-cover-colorant layer can be optional. FIG. 9C shows a cross-section of an exemplary photovoltaic roof tile, according to an embodiment. In FIG. 9C, solar roof tile 940 can include front cover 942, back cover 944, and encapsulant 950. Front-cover-colorant layer 946 can be attached to the interior surface of transparent front cover 942. On the other hand, back cover 944 is not covered by any colorant layer. In some embodiments, back cover 944 can be a non-transparent PV backsheet. Alternatively, back cover 944 can include colored glass. Cascaded photovoltaic string 952 and its external electrodes 954 can be embedded within encapsulant 950.

Figure 10A:
FIG. 10A shows the street view of solar roof tiles without the front-cover-colorant layer.
Figure 10B:
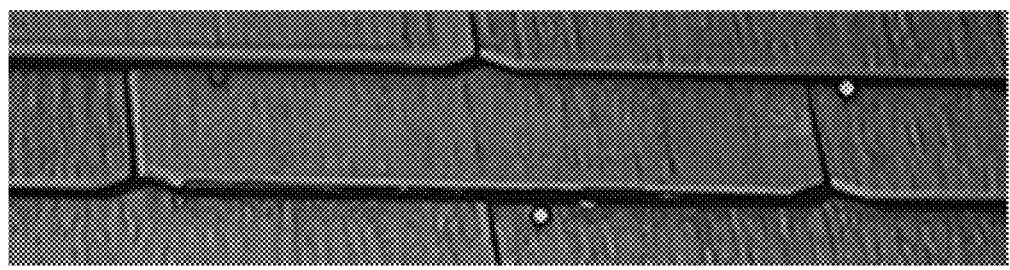
FIG. 10B shows the street view of solar roof tiles with the front-cover-colorant layer, according to one embodiment.

FIG. 10A shows the street view of solar roof tiles without the front-cover-colorant layer. As one can see, although the back cover has been color-matched to the photovoltaic structures, the color contrast between border regions 1002 and 1004 and the photovoltaic structures is significant. As a result, the photovoltaic structures appear to "float" above the back cover of the solar roof tile. FIG. 10B shows the street view of solar roof tiles with the front-cover-colorant layer, according to one embodiment. As one can see, after applying a colorant layer onto the front cover, the photovoltaic structures seamlessly blend in with the background, and the solar roof tiles appear very similar to traditional roof tiles. Compared with other approaches for hiding the photovoltaic structures, the current approach improves the aesthetics of the solar roof tiles using simpler and cheaper fabrication processes.

Fabrication of a Photovoltaic Roof Tile

Figure 11:
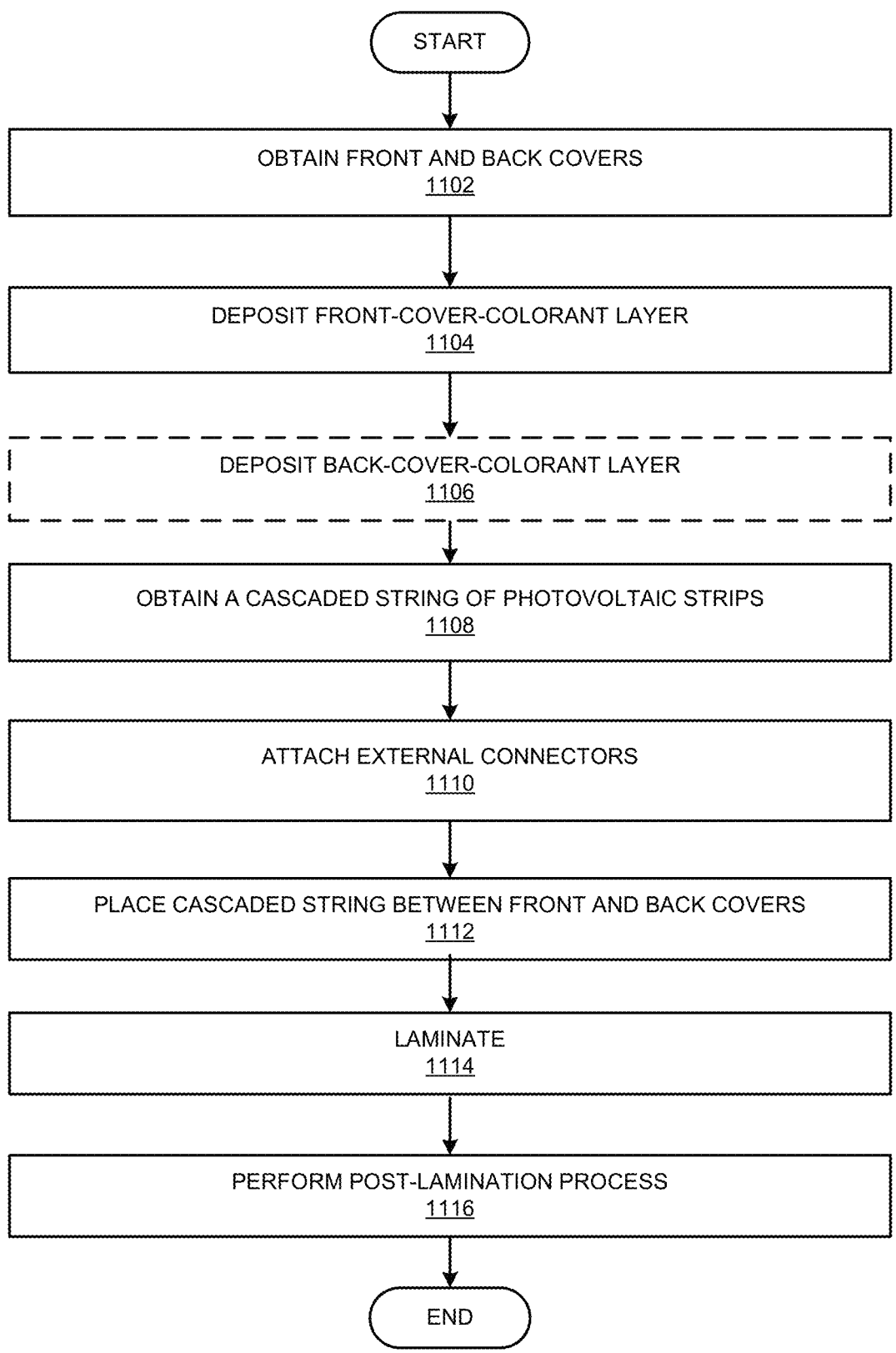
FIG. 11 presents a flowchart illustrating an exemplary process for fabricating a photovoltaic roof tile, according to an embodiment.

FIG. 11 presents a flowchart illustrating an exemplary process for fabricating a photovoltaic roof tile, according to an embodiment. During fabrication, a front cover and a back cover can be separately obtained (operation 1102). Both front and back covers can include a sheet of tempered or fortified glass. In some embodiments, obtaining the front and back covers can include texturing the interior surface of the front and back covers. In alternative embodiments, only the front cover is made of glass, whereas the back cover can include a PV backsheet.

Subsequently, a front-cover-colorant layer can be deposited onto the border region of the interior surface of the front cover, forming the front side bezel (operation 1104). In some embodiments, depositing the front-cover-colorant layer can involve screen printing a layer of glass frit of a certain color (e.g., blue or black). The glass frit layer can also be cured at an elevated temperature. The thickness of the glass frit layer can be between 10 and 30 microns. The glass front cover and the front side bezel layer (i.e., the front-cover-colorant layer) can also be collectively referred to as the front cover of the solar roof tile. A back-cover-colorant layer can optionally be deposited onto the interior or exterior surface of the back cover (operation 1106). In some embodiments, a back side bezel may also be created by depositing the back-cover-colorant layer onto the border region of the interior surface of the back cover. Depositing the back-cover-colorant layer can involve screen printing a layer of glass frit or spray painting a layer of acrylic paint.

A cascaded string of photovoltaic strips can be obtained (operation 1108). More specifically, the photovoltaic strips can be obtained by dividing a standard square or pseudo-square solar cell into multiple pieces, and a string of strips can be formed by cascading multiple strips at the edges. The cascading forms a serial connection among the strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, instead of conductive paste, electrical and mechanical bonding between the adjacent strips at their corresponding edges can be achieved via adhesive conductive films. Detailed descriptions about the bonding of adjacent photovoltaic strips using adhesive conductive films can be found in U.S. patent application Ser. No. 16/007,599, entitled "CASCADED SOLAR CELL STRING USING ADHESIVE CONDUCTIVE FILM," filed Jun. 13, 2018, the disclosure of which is incorporated herein by reference in its entirety.

In some embodiments, each individual solar roof tile may include one string, and each string can include six cascaded strips. Subsequent to the formation of a string, external electrical connectors (e.g., strain-relief connectors) can be attached to appropriate busbars (e.g., an edge busbar or an additional busbar away from the edge) (operation 1110). Various electrical coupling methods can be used to attach the strain-relief connectors to the busbars, including but not limited to: soldering, welding, or bonding with electrically conductive adhesive (ECA).

Subsequently, the cascaded string of PV strips along with the attached external connectors can then be placed between a front cover and a back cover, embedded in encapsulant (operation 1112). A lamination operation can be performed to encapsulate the string of photovoltaic strips along with the attached external connectors inside the front and back covers (operation 1114). A post-lamination process (e.g., trimming of overflowed encapsulant and attachment of other roofing components) can then be performed to complete the fabrication of a solar roof tile (operation 1116). Note that the process of fabricating a passive roof tile can be similar, except that there is no longer a need to place the cascaded string between the covers and that the front-cover-colorant layer now covers the entire surface of the front cover.

In some embodiments, instead of a single roof tile, multiple tiles can be fabricated together to form a multi-tile module. In such a scenario, inter-tile spacers can be used to provide rigid or semi-rigid bonding between the adjacent tiles. For aesthetic effect, the surface color of the inter-tile spacers also matches the color of the photovoltaic structures.

In general, embodiments of the present invention provide a cost-effective way for achieving a desired aesthetic of a solar roof tile without sacrificing solar cell efficiency. By pre-decorating the transparent front cover with a bezel, one can effectively mask the external electrodes and borders of the solar roof tile, thus achieving a uniform color effect across the entire solar roof tile surface. Moreover, passive roof tiles can also be fabricated by depositing a similar colorant layer that covers the entire surface of the front or back cover, thus achieving a similar appearance as that of the solar roof tile. A solar roof that includes both solar roof tiles and passive roof tiles can appear to have a uniform appearance when viewed from the street.

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof tile, comprising:
   a transparent front cover;
   a back cover,
   a back-cover-colorant layer;
   a plurality of photovoltaic structures arranged in a cascaded string and positioned between the transparent front cover and the back cover, the plurality of photovoltaic structures covering a first area of the back cover; and
   a front-cover-colorant layer positioned on a surface of the transparent front cover and defining a first opening having a second area, the first opening being positioned above the plurality of the photovoltaic structures, wherein the second area is greater than the first area, such that only a portion of the back-cover-colorant layer bordering the cascaded string is visible through the first opening, and wherein a color of the front-cover-colorant layer, a color of the back-cover-colorant layer and a color of the plurality of the photovoltaic structures match to cooperatively provide a substantially uniform appearance of the photovoltaic roof tile,
   wherein the back-cover-colorant layer defines a second opening that is positioned directly beneath the plurality of the photovoltaic structures and extends over a third area of the back cover that is smaller than the first area such that a portion of the plurality of the photovoltaic structures is visible through the second opening from an exterior of the photovoltaic roof tile.

2. The photovoltaic roof tile of claim 1, wherein a respective photovoltaic structure comprises a first edge busbar positioned near an edge of a first surface and a second edge busbar positioned near an opposite edge of a second surface, and wherein the plurality of the photovoltaic structures is arranged in such a way that the first edge busbar of a first photovoltaic structure overlaps the second edge busbar of an adjacent photovoltaic structure, thereby resulting in the plurality of the photovoltaic structures forming the cascaded string.

3. The photovoltaic roof tile of claim 2, further comprising an external conductive connector coupled to an exposed edge busbar of the cascaded string.

4. The photovoltaic roof tile of claim 3, wherein the external conductive connector is positioned beneath the front-cover-colorant layer, thus being out of sight when viewed from outside of the transparent front cover.

5. The photovoltaic roof tile of claim 1, wherein the transparent front cover comprises glass.

6. The photovoltaic roof tile of claim 5, wherein the front-cover-colorant layer comprises a layer of glass frit.

7. The photovoltaic roof tile of claim 5, wherein the front-cover-colorant layer is positioned on an interior surface of the transparent front cover and interior surface of the transparent front cover is textured.

8. The photovoltaic roof tile of claim 1, wherein the back cover comprises glass, and wherein the back-cover-colorant layer is positioned on a surface of the back cover.

9. The photovoltaic roof tile of claim 1, wherein the back-cover-colorant layer is positioned on a surface of the back cover.

10. The photovoltaic roof tile of claim 1, wherein the first opening defined by the front-cover-colorant layer has the same shape as the plurality of the photovoltaic structures.

11. A photovoltaic roof tile, comprising:
    a transparent front cover;
    a back cover
    a back-cover-colorant layer;
    a photovoltaic structure positioned between the transparent front cover and the back cover, the photovoltaic structure covering a first area of the back cover; and
    a front-cover-colorant layer positioned on a surface of the transparent front cover that faces the back cover and defining a first opening having a second area, the first opening being positioned above the photovoltaic structure, wherein the second area is greater than the first area such that only a portion of the back-cover-colorant layer bordering the photovoltaic structure is visible through the first opening, and wherein a color of the front-cover-colorant layer, a color of the back-cover-colorant layer and a color of the photovoltaic structures match to cooperatively provide a substantially uniform appearance of the photovoltaic roof tile, wherein the back-cover-colorant layer defines a second opening that is positioned directly beneath the photovoltaic structure and extends over a third area of the back cover that is smaller than the first area such that a portion of the photovoltaic structure is visible through the second opening from an exterior of the photovoltaic roof tile.

12. The photovoltaic roof tile of claim 11, wherein the transparent front cover comprises a glass sheet.

* * * * *